(12) United States Patent
Yo et al.

(10) Patent No.: US 7,690,869 B2
(45) Date of Patent: Apr. 6, 2010

(54) NON-CONTACT TRANSPORT APPARATUS

(75) Inventors: Seikai Yo, Toride (JP); Katsuaki Takahashi, Toride (JP); Masayuki Hosono, Toride (JP); Kazuo Nakano, Komae (JP)

(73) Assignee: SMC Kabushiki Kaisha, Tokyo (JP)

( * ) Notice: Subject to any disclaimer, the term of this patent is extended or adjusted under 35 U.S.C. 154(b) by 74 days.

(21) Appl. No.: 11/865,150

(22) Filed: Oct. 1, 2007

(65) Prior Publication Data

US 2008/0079208 A1 Apr. 3, 2008

(30) Foreign Application Priority Data

Oct. 2, 2006 (JP) .............................. 2006-270735

(51) Int. Cl.
  *B65G 53/00* (2006.01)
  *B25B 11/00* (2006.01)
(52) U.S. Cl. .............................. 406/88; 269/20; 269/21; 294/64.1
(58) Field of Classification Search ................... 406/86, 406/88, 92; 269/20, 21; 294/64.3; 414/676
  See application file for complete search history.

(56) References Cited

U.S. PATENT DOCUMENTS

| | | | | |
|---|---|---|---|---|
| 4,445,494 A | * | 5/1984 | Schiele et al. ................. | 125/35 |
| 5,169,196 A | * | 12/1992 | Safabakhsh ................. | 294/64.3 |
| 6,099,056 A | * | 8/2000 | Siniaguine et al. ......... | 294/64.3 |
| 6,427,991 B1 | * | 8/2002 | Kao ............................ | 269/21 |
| 6,467,297 B1 | * | 10/2002 | Bollinger et al. .............. | 62/404 |
| 6,601,888 B2 | * | 8/2003 | McIlwraith et al. ......... | 294/64.3 |
| 6,899,788 B2 | * | 5/2005 | Kao ....................... | 156/345.53 |
| 7,360,322 B2 | * | 4/2008 | Iwasaka et al. ................ | 34/576 |
| 7,452,016 B2 | * | 11/2008 | Tanae ......................... | 294/64.3 |
| 7,510,226 B2 | * | 3/2009 | Akiyama .................... | 294/64.3 |
| 2006/0070422 A1 | | 4/2006 | Kempf et al. | |
| 2006/0113719 A1 | | 6/2006 | Nagai et al. | |
| 2006/0290151 A1 | | 12/2006 | Akiyama | |

FOREIGN PATENT DOCUMENTS

| | | |
|---|---|---|
| DE | 10 2004 045 957 | 4/2006 |
| JP | 62-211236 | 9/1987 |
| JP | 2002-64130 | 2/2002 |
| JP | 2005-051260 | 2/2005 |
| JP | 2006-156692 | 6/2006 |
| WO | WO 2005/086225 | 9/2005 |

* cited by examiner

*Primary Examiner*—Gene Crawford
*Assistant Examiner*—William R Harp
(74) *Attorney, Agent, or Firm*—Paul A. Guss

(57) ABSTRACT

An inner member having a supply port is installed at the inside of a housing, wherein the housing and the inner member are connected together by connecting bolts. Air is supplied to the supply port of the inner member and is directed and introduced through communication passages into an annular passage. Thereafter, the air is directed outwardly from a plurality of lead-out holes, which communicate with the annular passage, in a swirling direction with respect to an annular recess facing the workpiece. In addition, by having the air flow along the annular recess, which is formed with a substantially trapezoidal shape in cross section, the workpiece is maintained in a non-contact state with respect to a holding surface of the inner member.

9 Claims, 8 Drawing Sheets

NON-CONTACT TRANSPORT APPARATUS

BACKGROUND OF THE INVENTION

1. Field of the Invention

The present invention relates to a non-contact transport apparatus capable of maintaining and transporting a workpiece in a non-contact state by a pressure fluid.

2. Description of the Related Art

Heretofore, non-contact transport apparatuses have been known for handling the transport of semiconductor wafers, and which are capable of transporting workpieces formed as sheet shaped parts, making up liquid crystal and plasma display devices, in a non-contact manner utilizing the Bernoulli effect generated by the flow of a gas.

Such a non-contact transport device, for example, as disclosed in Japanese Laid-Open Patent Publication No. 2002-64130, includes a recess wherein an inner circumferential surface thereof has a cylindrical shape, and a flat surface is formed on an opening side of the recess facing the workpiece, together with a fluid passage for ejecting a supplied fluid to the interior of the recess from jetting holes facing the inner circumferential surface of the recess. In addition, by causing a flow of air current at high speeds between the flat surface and the workpiece by means of air supplied from a fluid introduction port, a negative pressure is generated by the Bernoulli effect and the workpiece is lifted, whereby the workpiece can be transported by means of positive pressure air currents that flow between the flat surface and the workpiece, while maintaining a non-contact state therebetween.

Further, in this type of non-contact transport apparatus, the supplied amount (pressure) of air is constant, wherein workpieces having various weights and sizes respectively are transported. Accordingly, there has been a demand to be able to maintain and transport even larger and heavier workpieces by increasing the force at which workpieces can be held. At the same time, there has also been a demand to stably maintain and transport thin lightweight workpieces. More specifically, a non-contact transport apparatus has been desired, which is capable of maintaining and transporting even more various types of workpieces, while enlarging the range at which the workpieces can be maintained, with respect to a fixed supply amount (pressure) of air.

SUMMARY OF THE INVENTION

A general object of the present invention is to provide a non-contact transport apparatus, which is capable of reliably and stably maintaining and transporting workpieces, while enlarging the range at which such workpieces can be maintained with respect to a supplied amount of air.

The above and other objects features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
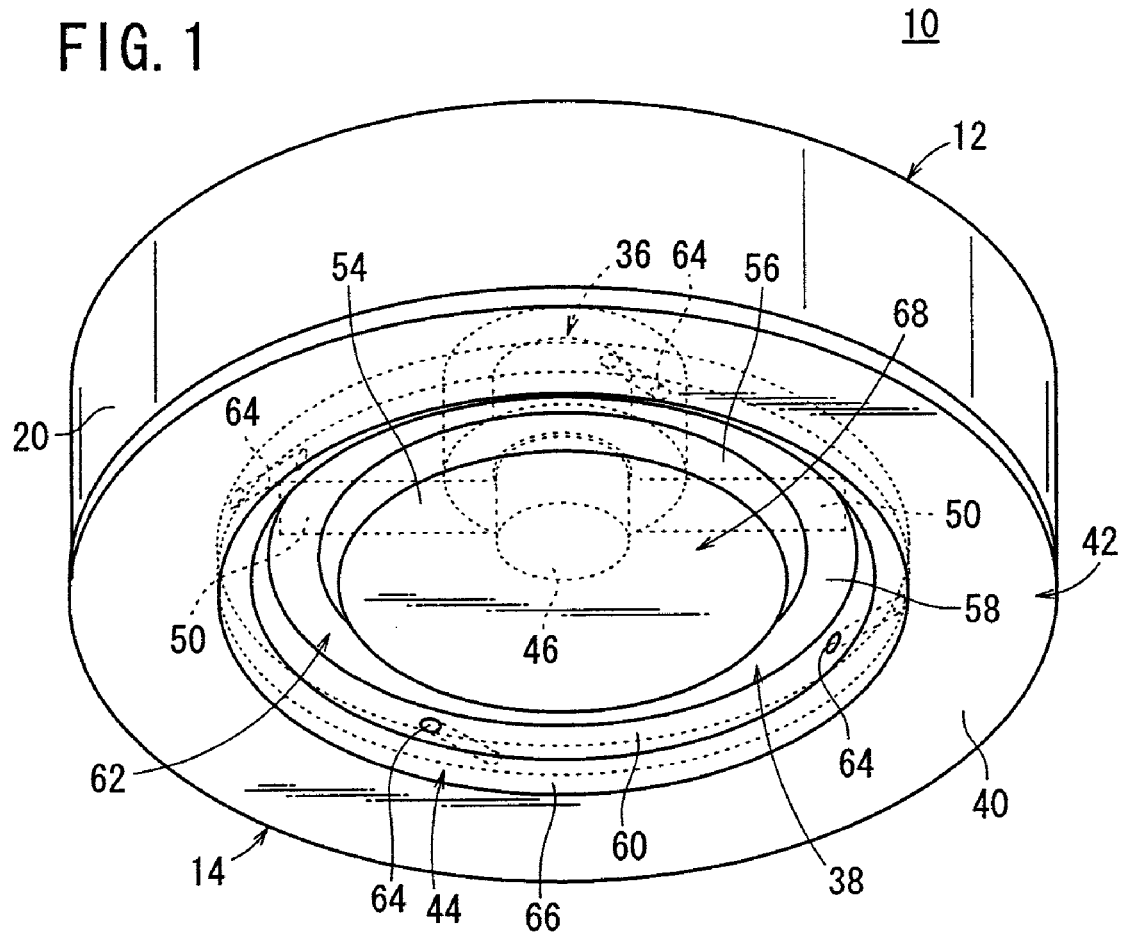
FIG. 1 is an overall perspective view showing a non-contact transport apparatus according to a first embodiment of the present invention.
Figure 2:
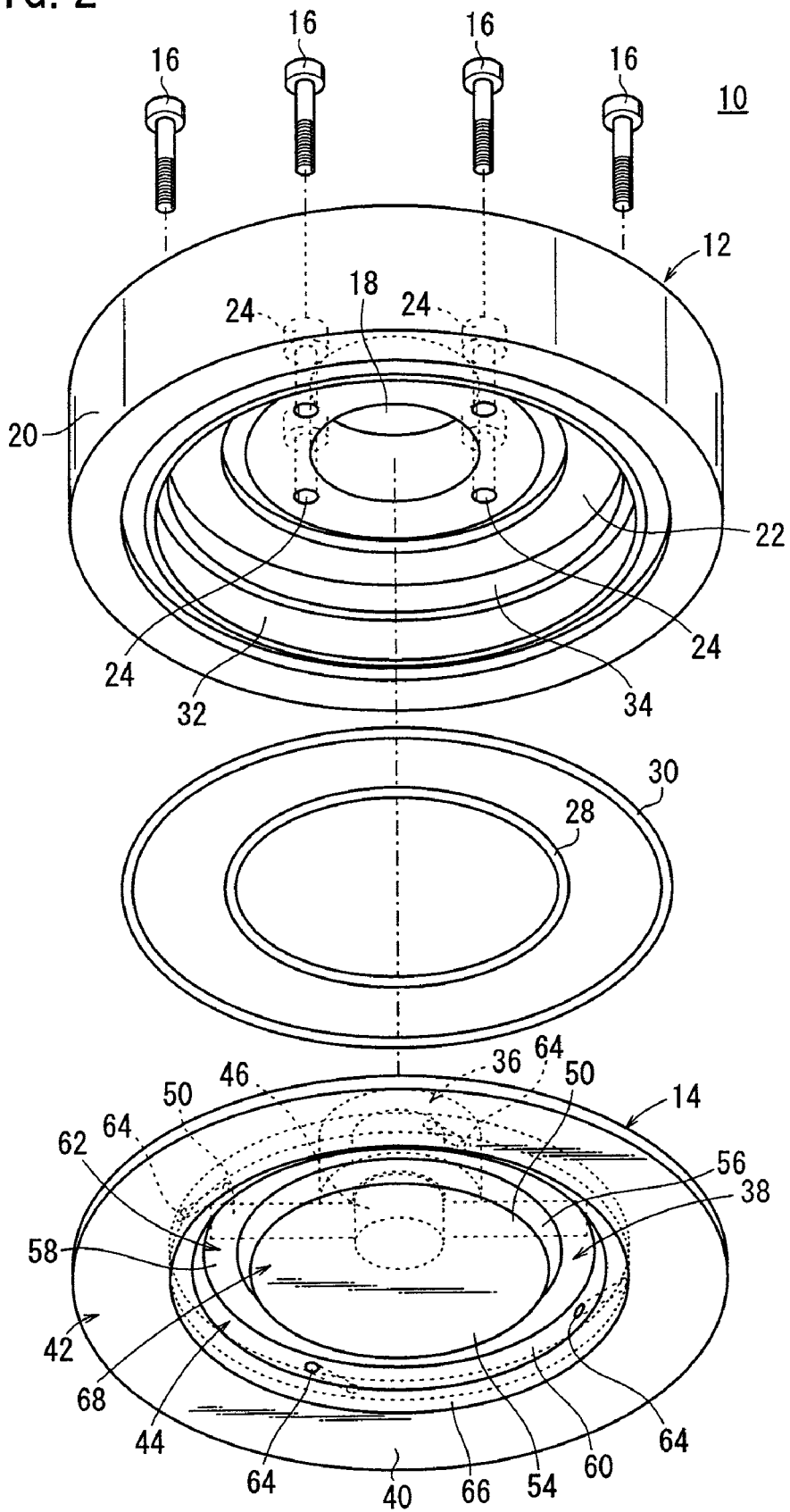
FIG. 2 is an exploded perspective view of the non-contact transport apparatus shown in FIG. 1.
Figure 3:
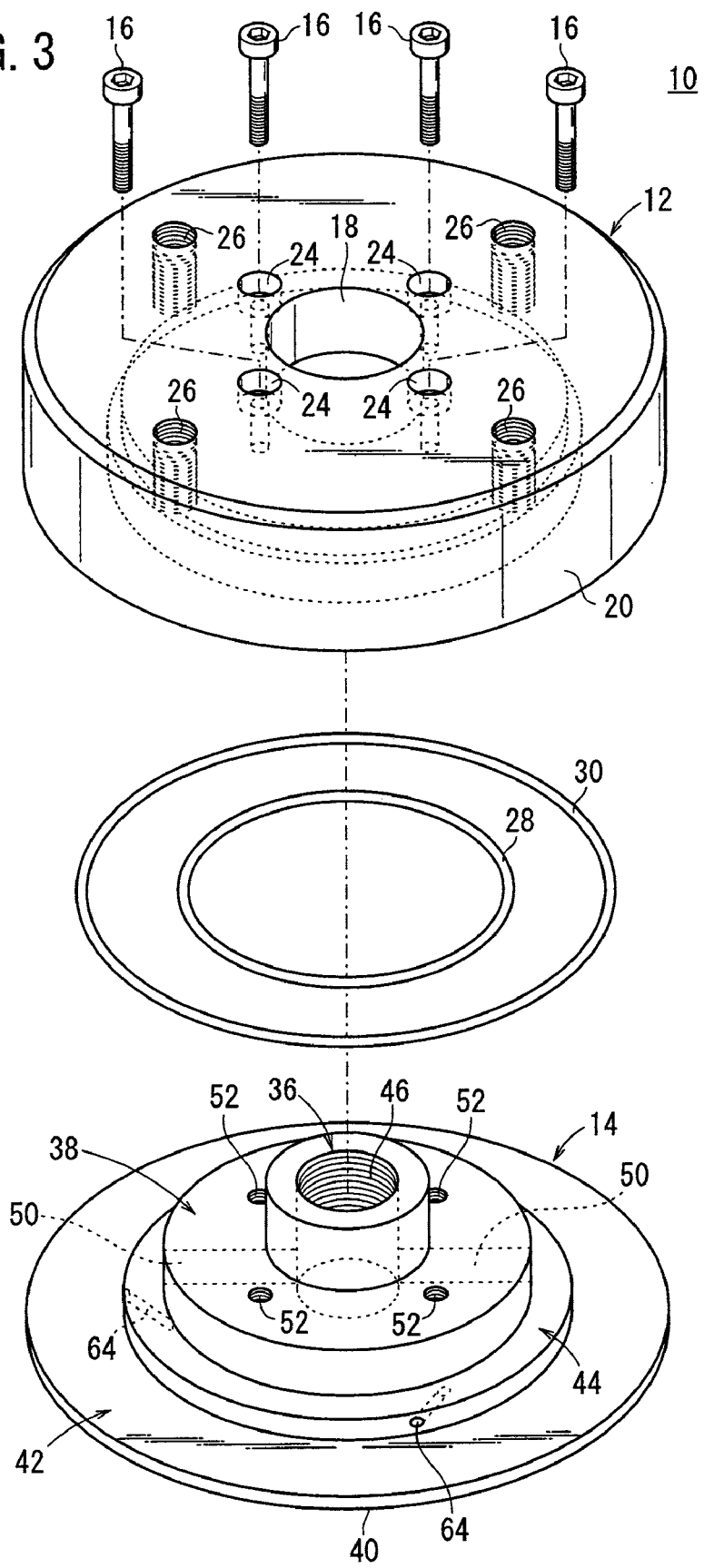
FIG. 3 is an exploded perspective view, as viewed from a different direction, of the non-contact transport apparatus shown in FIG. 2.

Reference numeral 10 in FIG. 1 indicates a non-contact transport apparatus in accordance with an embodiment of the present invention.

The non-contact transport apparatus 10, as shown in FIGS. 1 to 4, comprises a housing (body) 12 formed with a substantially U-shaped cross section, and a inner member (body) 14, which is installed into the housing 12, wherein a disk shaped formation is created by interconnecting the housing 12 and the inner member 14 through a plurality of connecting bolts 16.

The housing 12 includes a hole 18 formed substantially in the center thereof and into which a portion of the inner member 14 is inserted, and an annular flange 20 that is disposed at an outer circumferential part thereof and extends in a vertical direction forward the inner member 14. A space 22 that communicates with the hole 18 is disposed on an inner circumferential side of the flange 20. The flange 20 is formed substantially parallel to an axis of the housing 12.

The hole 18 has a substantially constant diameter. A plurality of bolt holes 24 through which connecting bolts 16 are inserted are disposed on an outer circumferential side of the hole 18, and a plurality of mounting holes 26 are disposed further radially outward from the bolt holes 24. The bolt holes 24 and the mounting holes 26 are arranged respectively on the same diameters, and are separated at equal intervals, taking the hole 18 as the center. The mounting holes 26 are used, for example, when the non-contact transport apparatus 10 is connected with respect to equipment such as a robot arm or the like.

Further, on the inner wall surface of the housing 12 facing the inner member 14, a first seal member 28 is installed through an annular groove lying between the bolt holes 24 and the mounting holes 26, and a second seal member 30 is installed similarly through an annular groove on a lower end surface of the flange 20. When the housing 12 and the inner member 14 are connected, the first and second seal members 28, 30 prevent external leakage of air that passes between the housing 12 and the inner member 14.

The outer circumferential surface of the flange 20 is formed with a substantially constant diameter, whereas the inner circumferential surface 32 of the flange 20 includes a stepped portion 34, which expands in diameter in a stepped fashion toward the lower end surface side of the housing 12.

The inner member 14 has a substantially T-shaped cross section, and includes a cylindrically shaped boss 36 formed substantially centrally thereon, a base 38 formed at an end of the boss 36 and expanding in diameter by a predetermined radial amount therefrom, a plate 42 arranged radially outward with respect to the base 38 and providing a holding surface 40 for maintaining the workpiece W (see FIG. 4), and a joining section 44 that connects the base 38 and the plate 42.

The boss 36 is inserted through the hole 18 of the housing 12, and a supply port 46 (air supply portion), through which air is supplied, is formed substantially centrally therein along the axial direction. A coupling connected to an unillustrated tube is fitted by threaded engagement with the supply port 46, wherein air is supplied through the tube to the supply port 46 from an air supply source (not shown).

The base 38 is disposed in a space 22 of the housing 12, such that an outer circumferential surface thereof faces toward the inner circumferential surface 32 of the flange 20. In addition, an annular passage 48 through which air flows is defined between the inner circumferential surface 32 of the flange 20 including the stepped portion 34 thereof and the outer circumferential surface of the base 38. More specifically, the annular passage 48 defines a space in which an airtight state is maintained by means of the first seal member 28 disposed on the inner circumferential side and the second seal member 30 disposed on the outer circumferential side.

Further, at the interior of the base 38, plural (e.g., two) communication passages (passages) 50 are formed, which are connected to the supply port 46 and extend in a radially outward direction. The communication passages 50 are arranged and separated at equal intervals in the circumferential direction about the center of the supply port 46, and penetrate to an outer circumferential surface of the base 38, facing the flange 20 of the housing 12. In addition, the communication passages 50 communicate both with the supply port 46 and the annular passage 48 defined on an outer circumferential side of the inner member 14.

Respective screw holes 52, which are positioned so as to confront the bolt holes 24 of the housing 12, are disposed in the base 38. By threaded engagement of the connecting bolts 16 that are inserted through the bolt holes 24 respectively with the screw holes 52, the housing 12 and the inner member 14 are connected together. The plural screw holes 52 are formed at positions lying between the plural communication passages 50.

Moreover, because the first seal 28 installed in the inner wall surface of the housing 12 abuts against the base 38, leakage of air that passes between the base 38 and the housing 12 is prevented.

On the other hand, an outwardly bulging portion (projection) 54, which bulges outwardly in a substantially trapezoidal shape in cross section, in a direction separating away from the boss 36 (i.e., in the direction of the arrow X), is formed on the lower end of the base 38. The bulging portion 54 is disposed centrally on the base 38, and has a first tapered surface (second slanted surface) 56 formed on an outer circumference thereof, which becomes reduced gradually in diameter in a direction separating away from the base 38 (i.e., in the direction of the arrow X). The angle of inclination $\theta 1$ of the first tapered surface 56 is set, for example, to be greater than or equal to 30° and less than 90° (30°≦$\theta 1$<90°) with respect to a bottom wall surface (wall surface) 58 of the base 38, which defines an initial point of the first tapered surface 56. The bottom wall surface 58 of the base 38 is disposed substantially parallel to the holding surface 40 of the plate 42, to be discussed in greater detail below (see FIG. 5). Further, the angle of inclination $\theta 1$ of the first tapered surface 56 may, for example, be set optimally at an angle of 60° with respect to the bottom wall surface 58 of the base 38 ($\theta 1$=60°).

The plate 42 is formed with substantially the same diameter as the outer peripheral diameter of the housing 12 and has a uniform thickness. The plate 42 is arranged so as to cover a lower end surface of the flange 20 that makes up the housing 12. More specifically, the upper surface of the plate 42 facing the housing 12 abuts with the flange 20, whereas the lower surface thereof, which is exposed to the exterior, functions as a holding surface 40 capable of maintaining the workpiece W.

Figure 4:
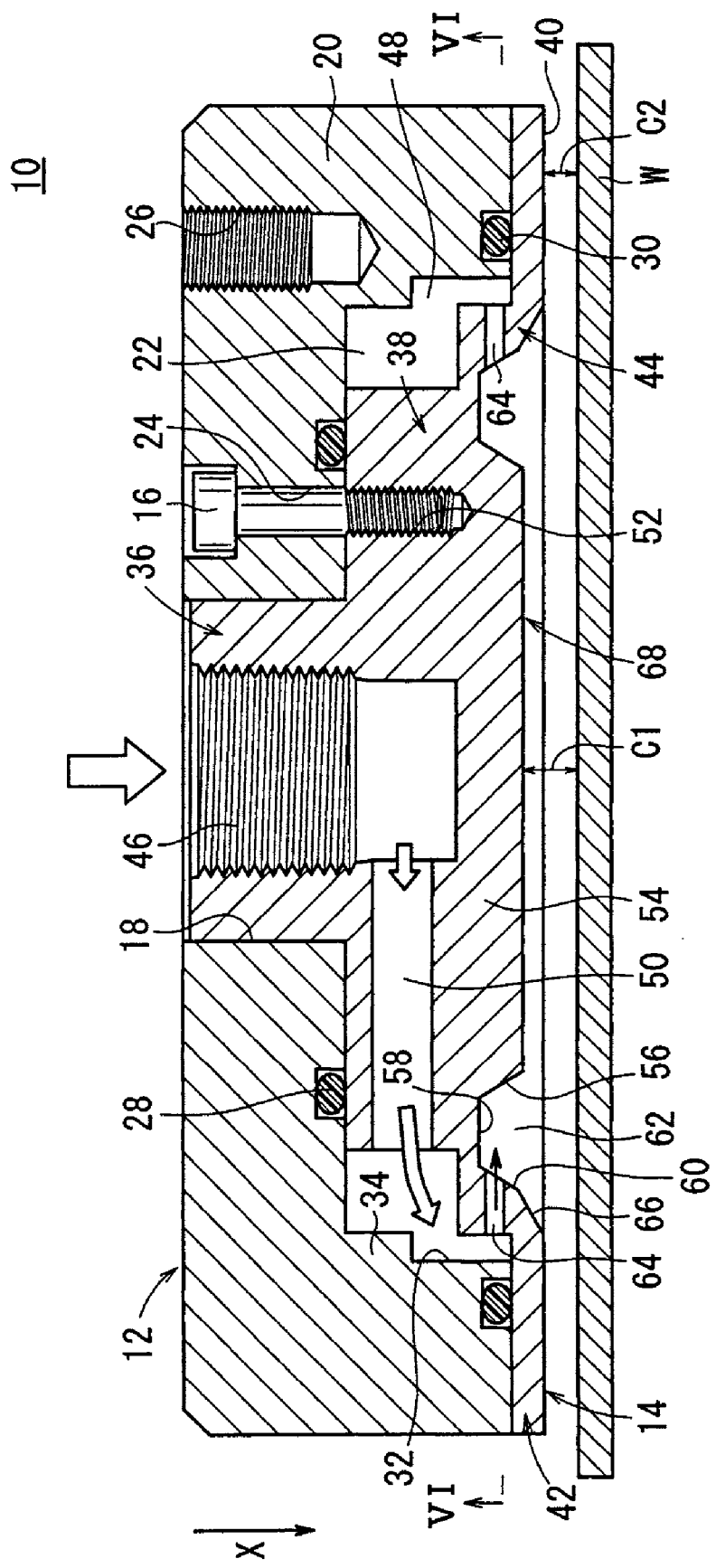
FIG. 4 is a vertical cross sectional view of the non-contact transport apparatus shown in FIG. 1.

Further, the holding surface 40 is disposed such that it projects a predetermined height T beyond an end surface of the bulging portion 54 provided on the inner member 14. Stated otherwise, the end surface of the bulging portion 54 is disposed in such a manner that it is retracted inwardly by the predetermined height T, with respect to the holding surface 40 that faces the workpiece W. As shown in FIG. 4, a clearance C1 between the workpiece W and the bulging portion 54 is greater than a clearance (separation distance) C2 between the workpiece W and the holding surface 40 (C1>C2).

Further, by abutment of the second seal member 30 installed in the flange 20 against the plate 42, leakage of air that passes between the plate 42 and the housing 12 is prevented.

The joining section 44 extends radially outward from an outer circumferential region of the base 38 and is formed in an annular shape, connecting the base 38 with an inside circumferential region of the plate 42. A second tapered surface (first slanted surface) 60, which gradually expands in diameter from the base 38 toward the plate 42 (in the direction of the arrow X), is formed on the inner circumference of the joining section 44, whereas the outer circumference of the joining section 44 is formed with a substantially constant diameter parallel to the axis of the inner member 14.

Figure 5:
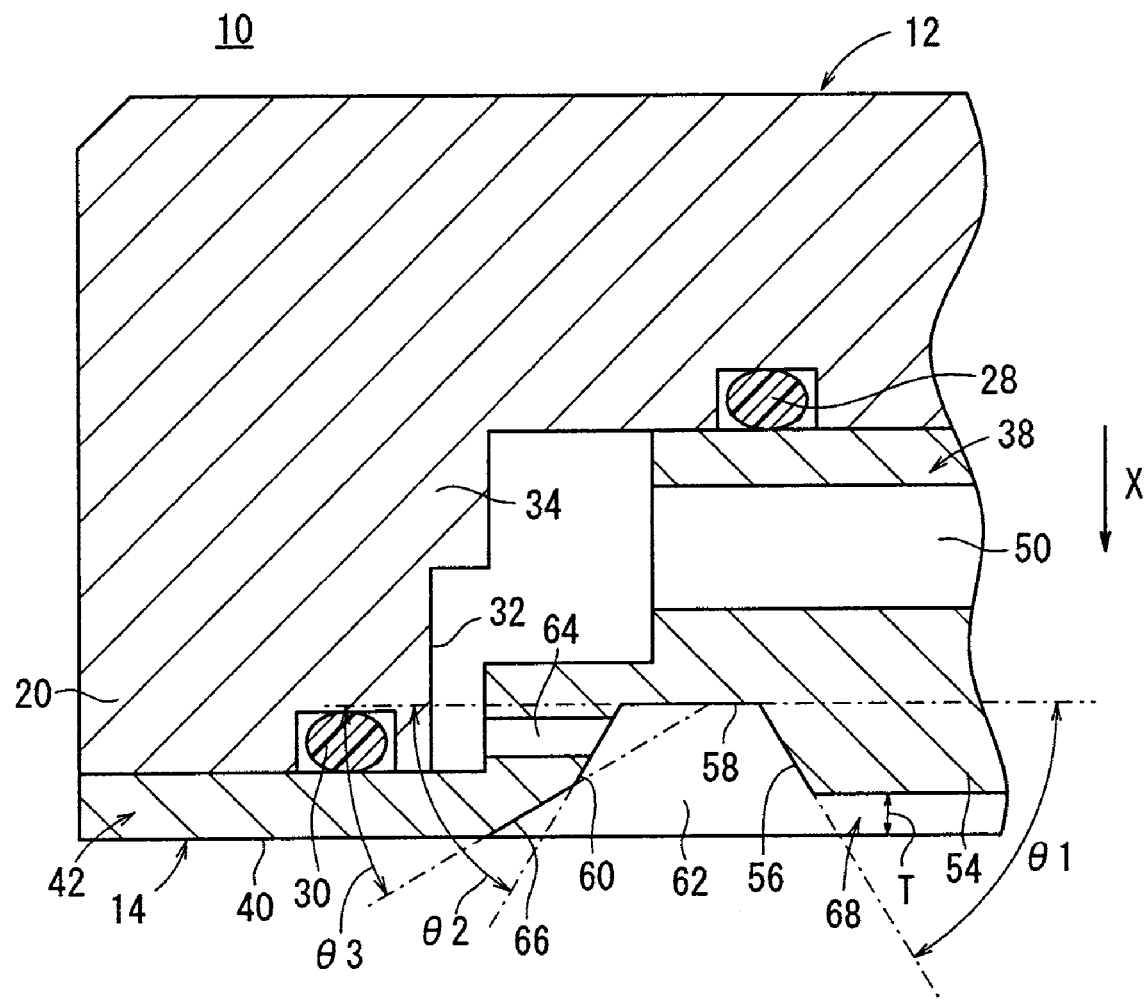
FIG. 5 is an enlarged cross sectional view showing a vicinity of an annular recess in the non-contact transport apparatus of FIG. 4.
Figure 6:
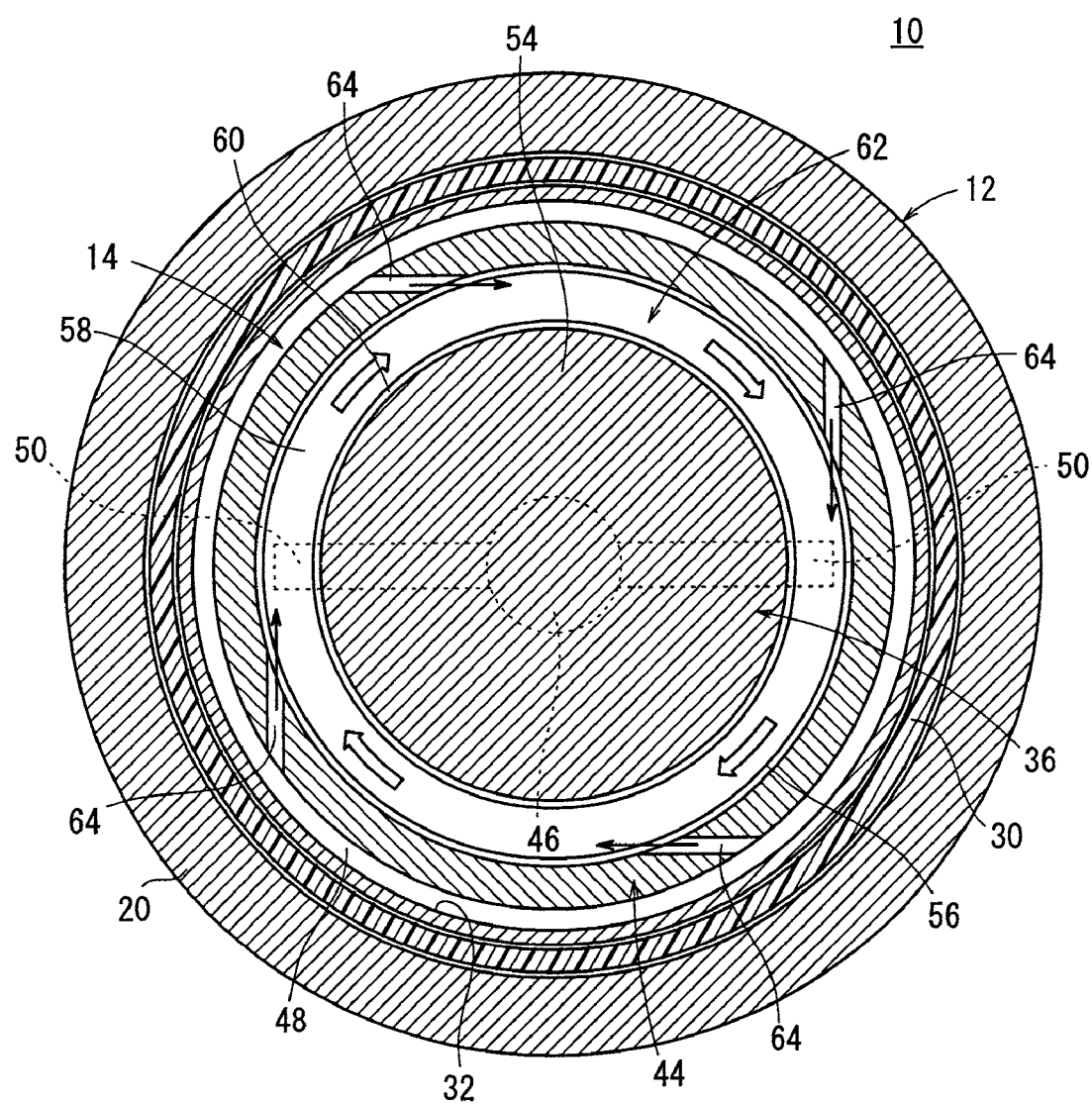
FIG. 6 is a cross sectional view taken along line VI-VI of FIG. 4.

As shown in FIG. 5, the angle of inclination $\theta 2$ of the second tapered surface 60 is set, for example, to be greater than or equal to 30° and less than 90° (30°≦$\theta 2$<90°) with respect to the bottom wall surface 58 of the base 38, which defines an initial point of the second tapered surface 60. The angle of inclination $\theta 2$ of the second tapered surface 60 may, for example, be set optimally at an angle of 60° with respect to the bottom wall surface 58 of the base 38 ($\theta 2$=60°).

Specifically, an annular recess 62 is defined on the inner member 14 by the bottom wall surface 58 of the base 38, the first tapered surface 56 of the bulging portion 54, and the second tapered surface of the joining section 44. The annular recess 62 is formed with a trapezoidal shape in cross section, gradually expanding in width in a direction separating away from the base 38 (in the direction of the arrow X).

Further, plural lead-out holes 64, communicating between the outer circumferential surface of the joining section 44 and the second tapered surface 60 on the inner circumferential side thereof, are formed in the joining section 44. The lead-out holes 64 are formed in a straight-line shape with substantially constant diameters, such that ends thereof on the side of the annular recess 62 open onto the second tapered surface 60.

The lead-out holes 64 are disposed tangentially with respect to the annular recess 62 formed between the joining section 44 and the bulging portion 54. Accordingly, the annular passage 48 and the annular recess 62 communicate with one another via the lead-out holes 64.

Further, the second tapered surface 60 is positioned adjacent to a third tapered surface 66 formed on an inner circumferential side of the plate 42. The third tapered surface 66 is inclined such that it gradually expands in diameter from the second tapered surface 60 toward the holding surface 40. The angle of inclination $\theta 3$ of the third tapered surface 66 is set to be smaller than the angle of inclination $\theta 2$ of the second tapered surface 60 with respect to the bottom wall surface 58 of the base 38 ($\theta 3$<$\theta 2$).

Specifically, when air flowing through the annular recess 62 flows toward the holding surface 40 along the second and third tapered surfaces 60 and 66, because the second tapered surface 60 expands in diameter in a stepwise fashion together with the third tapered surface 66, the air can be guided gradually toward the holding surface 40, and hence the air is caused to flow quite smoothly.

In addition, the swirl chamber 68 is defined on a lower portion of the inner member 14, surrounded by the bulging portion 54, the bottom wall surface 58 of the base 38, the second tapered surface 60 of the joining section 44, and the third tapered surface 66 of the plate 42. The swirl chamber 68 is formed to include the annular recess 62, wherein an outer circumferential surface thereof is formed in a tapered shape, gradually expanding in diameter toward the holding surface 40. Moreover, the inner circumferential surface is formed in a tapered shape gradually reducing in diameter toward a center side of the inner member 14, and wherein the substantially center portion thereof is retracted inwardly a predetermined length with respect to the holding surface 40.

The non-contact transport apparatus 10 according to the embodiment of the present invention is constructed basically as described above. Next, operations and advantages of the embodiment shall be explained.

Air is supplied to the supply port 46 through a tube from an unillustrated air supply source, whereupon the air supplied to the supply port 46 is directed into the annular passage 48 through the plural communication passages 50. In addition, the air is guided into the annular recess 62 through the plurality of lead-out holes 64 communicating with the annular passage 48. At this time, because the lead-out holes 64 are arranged and oriented tangentially with respect to the annular recess 62, the air guided outwardly from the lead-out holes 64 is supplied into the swirl chamber 68 and flows along the annular recess 62 in a swirling fashion. As a result, swirling air currents are generated in the swirl chamber 68 by the air, whereby the air flows through and along the annular recess 62, which is recessed inwardly with a substantially trapezoidal shape in cross section, while the air flow velocity increases.

In this case, because all of the plural lead-out holes 64 that open toward the side of the swirl chamber 68 are connected in a tangential direction with respect to the annular recess 62 constituting the swirl chamber 68, the flow directions of air guided into the annular recess 62 are oriented circumferentially in the same direction.

In addition, between the holding surface 40 and the workpiece W, which is arranged at a position facing the holding surface 40 of the inner member 14, air that is made to flow in a swirling fashion in the swirl chamber 68 flows toward the outer periphery at high speeds along the holding surface 40, and accordingly, a negative pressure is formed between the holding surface 40 and the workpiece W. In this case, the air flows within the swirl chamber 68 from the second tapered surface 60, formed on the outer circumferential side of the annular recess 62, and along the third tapered surface 66, thereby flowing smoothly to the holding surface 40.

As a result, a workpiece (e.g., a wafer or the like), which is arranged at a position facing the holding surface 40 of the inner member 14, is attracted under suction by the negative pressure generated in the swirl chamber 68, while on the other hand, a repulsive force is received as a result of air (positive pressure) that intervenes between the workpiece W and the holding surface 40 of the inner member 14, wherein by balancing the negative pressure and the positive pressure, the workpiece W is maintained in a non-contact state. As a result, while it is maintained in a held state, the workpiece W is transported on the holding surface 40 of the non-contact transport apparatus 10 to a predetermined position.

The positive and negative pressures operating on the workpiece W are changed as a result of the clearance C2 between the holding surface 40 of the inner member 14 and the workpiece W. Specifically, when the clearance becomes smaller, the negative pressure is reduced and the positive pressure increases. On the other hand, when the clearance C2 becomes larger, negative pressure is increased and positive pressure is lessened. In this case, the lifted workpiece W acquires an optimum clearance as a result of balancing between the self-weight of the workpiece W itself and the positive and negative pressures. Owing thereto, for example, workpieces W, such as wafers or flexible films, can be transported without being subjected to warping.

Figure 7:
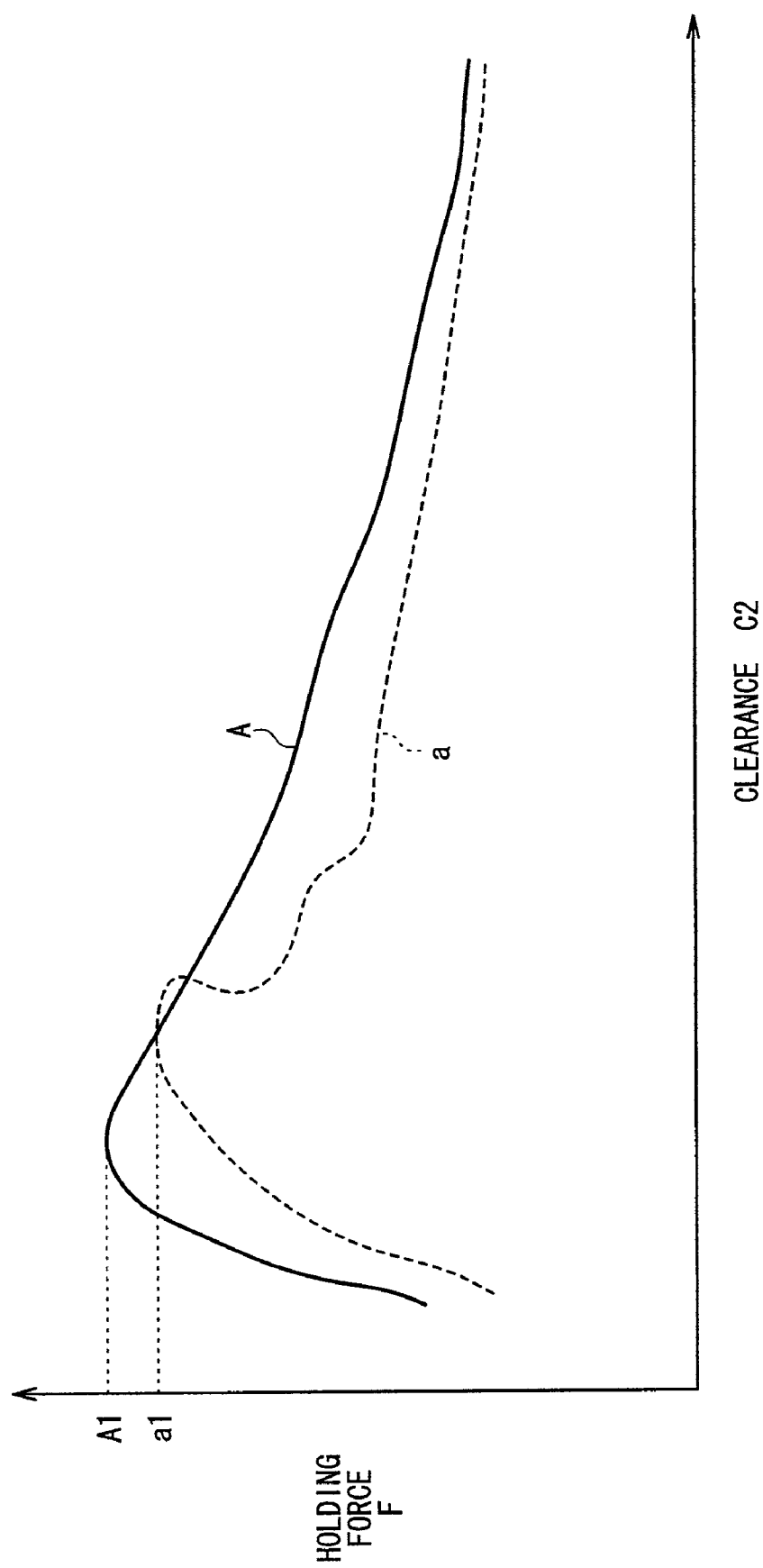
FIG. 7 is a graph showing a characteristic curve indicating a relationship between the force at which a workpiece can be maintained and a clearance between the workpiece and a holding surface, with respect to the configuration of a swirl chamber in the non-contact transport apparatus of FIG. 1.
Figure 8:
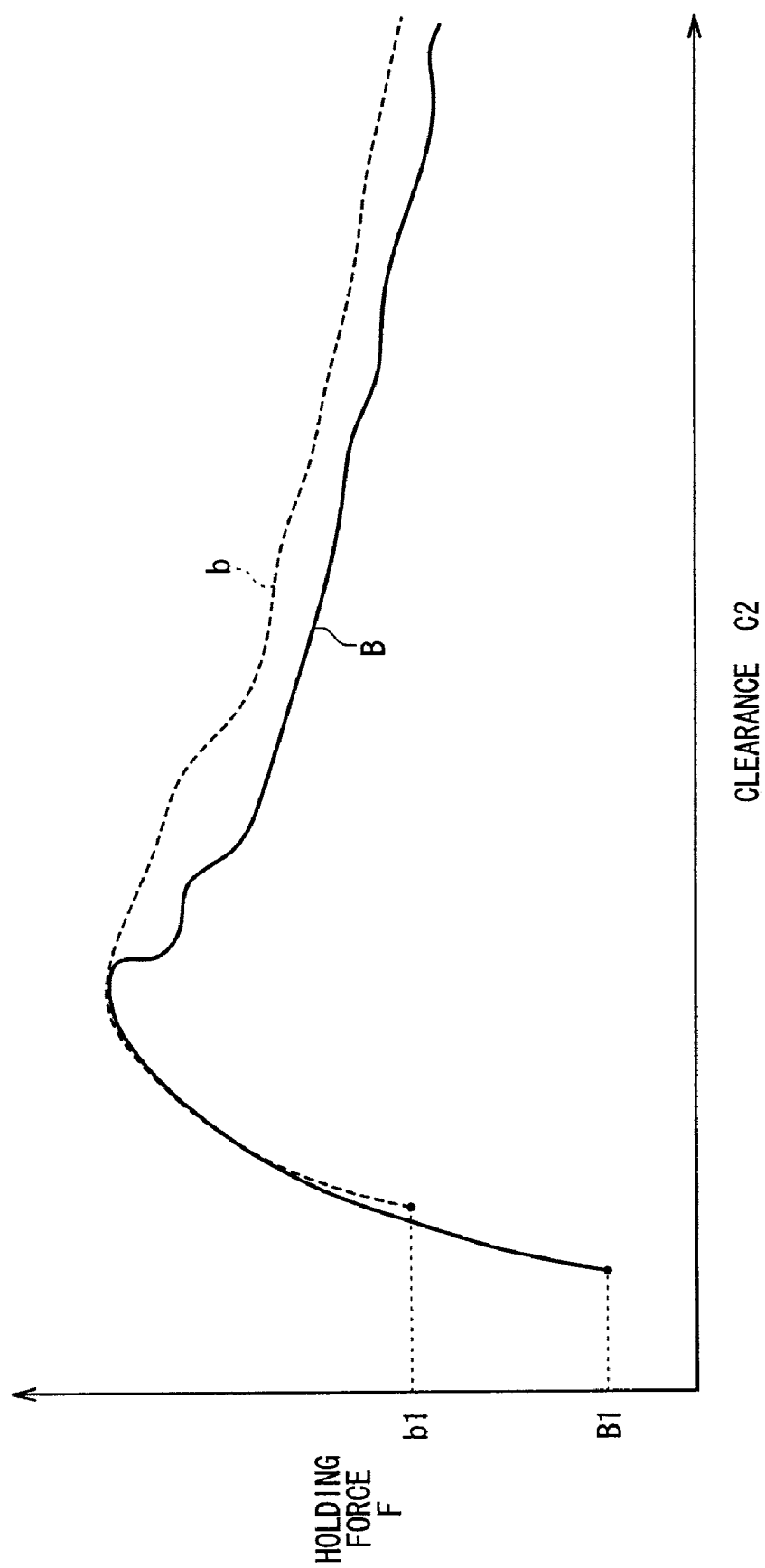
FIG. 8 is a graph showing a characteristic curve indicating a relationship between the force at which a workpiece can be held and a clearance between the workpiece and a holding surface, with respect to whether or not there is a bulging portion, in the non-contact transport apparatus of FIG. 1.

FIGS. 7 and 8 are views of characteristic curves indicating relationships between the clearance C2, formed between the workpiece W and the holding surface 40, and the holding force F at which the workpiece W can be maintained, in the non-contact transport apparatus 10. The solid line A shown in FIG. 7 indicates characteristics of the non-contact transport apparatus 10 according to the present embodiment, whereas the broken line a indicates characteristics of a case in which the outer circumferential surface of the swirl chamber is formed in a cylindrical shape extending in a vertical direction. On the other hand, the solid line B shown in FIG. 8 indicates characteristics of the non-contact transport apparatus 10 according to the above-described present embodiment, whereas the broken line b indicates characteristics of a non-contact transport apparatus, which is not provided with the bulging portion.

As shown in FIG. 7, it can be comprehended that by providing the second and third tapered surfaces 60, 66, which expand radially toward the side of the holding surface 40 on an outer circumferential surface of the swirl chamber 68 into which air is directed outwardly toward the workpiece W, the maximum value A1 of the holding force F when the workpiece W is maintained becomes greater, as compared to a maximum value a1 of the holding force F in the case when the outer circumferential surface of the swirl chamber is substantially cylindrically shaped and vertical with respect to the holding surface (A1>a1).

More specifically, by providing the second and third tapered surfaces 60, 66 on the outer circumferential surface of the swirl chamber 68, which expand diametrically toward the side of the holding surface 40, the air swirling within the swirl chamber 68 flows gradually toward the second tapered surface 60 and the third tapered surface 66, and flows smoothly over the holding surface 40. In this manner, the air within the swirl chamber 68 can be guided smoothly toward the holding surface 40 along the outer circumferential surfaces of the tapered shapes. Stated otherwise, the air that flows rapidly in the swirl chamber 68 does not peal away from the second and third tapered surfaces 60 and 66, but is directed outwardly to atmosphere while being guided smoothly over the holding surface 40.

Accordingly, since the outer circumferential surface of the swirl chamber 68 is formed with a tapered shape that expands in diameter toward the holding surface 40, the holding force F that maintains the workpiece W can be enlarged, and thus it is possible to reliably and stably support and transport heavier workpieces with a given fixed amount of supplied air.

As shown in FIG. 8, it can be understood that by providing the bulging portion 54, which bulges outwardly toward the workpiece W inside the swirl chamber 68 through which air flows, the minimum value B1 of the holding force F when the workpiece W is maintained becomes smaller, in comparison with the minimum value b1 in the case where a bulging portion 54 is not provided (B1<b1). Generally, in the event that workpieces are transported, which are lighter in weight than the workpieces W maintainable by the minimum values B1, b1 of the holding force F, there is a concern that such workpieces may experience undesirable vibrations.

In this manner, since by providing the bulging portion 54 the minimum valve B1 of the holding force F can be made smaller, even lightweight workpieces W can be reliably and stably transported.

More specifically, as can be comprehended from FIGS. 7 and 8, by providing the bulging portion 54 inside the swirl chamber 68, the minimum value B1 of the holding force F at which the workpiece W can be held can be made smaller. In addition, by providing the second and third tapered surfaces

60, 66 which expand in diameter toward the holding surface 40 on the outer circumferential surface of the swirl chamber 68, the maximum valve A1 of the holding force F can be made greater. As a result, the range (B1 to A1) of the holding force F at which workpieces W are capable of being maintained can be enlarged, and workpieces W can be more reliably and stably maintained with respect to the holding surface 40.

As described above, in the present embodiment, a bulging portion 54 that projects outwardly facing the workpiece W is disposed on the lower portion of the inner member 14. By providing the bulging portion 54 with a substantially trapezoidal shape in cross section, compared with a conventional non-contact transport apparatus not equipped with such a bulging portion 54, the range of the holding force F at which the workpiece W can be maintained can be enlarged, and thus workpieces W can be reliably and stably maintained with respect to the holding surface 40.

Furthermore, when the workpiece W approaches and is separated with respect to the holding surface 40, the air within the swirl chamber 68 functions as an air cushion with respect to the workpiece W. Owing thereto, by providing the bulging portion 54 in the swirl chamber 68, the volumetric capacity of the swirl chamber 68 can be made smaller. Consequently, as the volumetric capacity of the swirl chamber 68 becomes smaller, coupled vibrations generated between the swirl chamber 68 and the workpiece W, induced by functioning of the air cushion, are suitably suppressed.

Moreover, since the clearance C2 between the workpiece W and the holding surface 40 can be set to a small amount, the workpiece W can be maintained even more reliably and stably.

Still further, the swirl chamber 68 formed on the lower side of the inner member 14 and into which air is directed from the plural lead-out holes 64 is defined by the bulging portion 54, the bottom wall surface 58 of the base 38, the second tapered surface 60 formed on the inner circumferential side of the joining section 44, and the third tapered surface 66 formed on the inner circumferential side of the plate 42. The second and third tapered surfaces 60 and 66 are formed so as to gradually expand in diameter toward the side of the holding surface 40.

As a result, air that flows rapidly inside the swirl chamber 68 does not peel away from the second tapered surface 60 and the third tapered surface 66, and can flow smoothly to the outer atmosphere while being guided along the side of the holding surface 40. Consequently, compared with a conventional cylindrically shaped swirl chamber having a vertically disposed circumferential surface, a lower negative pressure (pressure distribution) is obtained between the holding surface 40 of the non-contact transport apparatus 10 and the workpiece W, whereby it is possible to increase the force at which workpieces W can be maintained with respect to the same air supply amount. As a result, with the non-contact transport apparatus 10, workpieces W can be stably held and transported via the holding surface 40.

The non-contact transport apparatus according to the present invention is not limited to the aforementioned embodiment, and various other structures may be adopted without deviating from the essence and gist of the invention.

What is claimed is:

1. A non-contact transport apparatus comprising:
   a body;
   a passage formed at an interior of said body, through which air supplied from an air supply portion passes;
   a holding surface disposed on an end of said body so as to face toward a workpiece;
   an annular swirl chamber disposed radially inwardly from said holding surface, and having an opening that faces said workpiece, with a first slanted surface, which expands gradually in diameter from a bottom wall surface of said annular swirl chamber in a direction toward said workpiece, wherein said bottom wall surface defines an initial point of said first slanted surface;
   lead-out holes connected with said first slanted surface of said swirl chamber, and communicating between said swirl chamber and said passage, for directing said air outwardly into said swirl chamber; and
   an outwardly bulging projection disposed substantially in the center of said swirl chamber, said projection becoming gradually reduced in diameter in a direction toward said workpiece, wherein a second slanted surface is formed on an outer circumferential portion of said projection from a bottom wall surface of said annular swirl chamber to an upper end surface of said projection, said bottom wall surface defining an initial point of said second slanted surface.

2. The non-contact transport apparatus according to claim 1, wherein said lead-out holes are connected tangentially with respect to said swirl chamber.

3. The non-contact transport apparatus according to claim 2, wherein a clearance between said projection and said workpiece is set to be larger than a clearance between said holding surface and said workpiece.

4. The non-contact transport apparatus according to claim 2, wherein an angle of inclination of said first slanted surface is set to be greater than or equal to 30° and less than 90° with respect to said bottom wall surface of said swirl chamber.

5. The non-contact transport apparatus according to claim 4, wherein an angle of inclination of said second slanted surface is set to be greater than or equal to 30° and less than 90° with respect to said bottom wall surface of said swirl chamber.

6. The non-contact transport apparatus according to claim 5, wherein said angle of inclination of said second slanted surface is set at 60°.

7. The non-contact transport apparatus according to claim 5, wherein said body includes a third slanted surface, which expands gradually in diameter in a direction toward said workpiece and is disposed radially inwardly from said holding surface, said third slanted surface being disposed on a side of said holding surface with respect to said first slanted surface, and wherein an angle of inclination of said third slanted surface with respect to said bottom wall surface of said swirl chamber is smaller than said angle of inclination of said first slanted surface.

8. The non-contact transport apparatus according to claim 4, wherein said angle of inclination of said first slanted surface is set at 60°.

9. The non-contact transport apparatus according to claim 1, wherein an inner wall surface of said passage is formed with a step portion, which expands in diameter in a stepped fashion toward said holding surface.

* * * * *